United States Patent [19]

Shintaku

[11] Patent Number: 5,140,267
[45] Date of Patent: Aug. 18, 1992

[54] PLURAL SUPERCONDUCTIVE MAGNETORESISTORS FOR MEASURING DISTRIBUTION OF MAGNETIC FIELD WITH INDIVIDUAL BIASING APPLIED SEQUENTIALLY

[75] Inventor: Hidetaka Shintaku, Nara, Japan

[73] Assignee: Sharp Kabushiki Kaisha, Osaka, Japan

[21] Appl. No.: 659,722

[22] Filed: Feb. 25, 1991

[30] Foreign Application Priority Data

Feb. 26, 1990 [JP] Japan .................................. 2-46370

[51] Int. Cl.⁵ .................... H01B 12/02; H01L 39/12; H01L 39/16; G01R 33/035
[52] U.S. Cl. .................................. 324/248; 324/252; 338/32 R; 338/32 S; 505/845
[58] Field of Search ...................... 324/248, 252, 261; 505/842, 845, 846; 338/32 R, 32 H, 32 S

[56] References Cited

U.S. PATENT DOCUMENTS 4,749,946 6/1988 Hoenig .................... 324/248

OTHER PUBLICATIONS

T. Ishiguro, et al. "Advances in Superconductivity II", Proceedings of the 2nd International Symposium on Superconductivity, Nov. 1989.

Primary Examiner—Walter E. Snow

[57] ABSTRACT

A magnetic field distribution measuring apparatus for measuring an external magnetic field distribution includes a substrate made of a nonmagnetic material and having opposite surfaces, a plurality of magnetoresistive elements deposited on one surface of the substrate and each made of a superconductive material having a weak coupling at the grain boundaries. Coils are provided on the other surface of the substrate at positions corresponding to the magnetoresistive elements. The coils are sequentially applied with AC current to produce AC magnetic field having a peak value greater than a magnetic field threshold level at which the magnetoresistive element changes the state from a superconductive state to a magnetoresistive state. Detecting the degree of magnetoresistive from each magnetoresistive element, the magnetic field distribution can be detected.

12 Claims, 8 Drawing Sheets

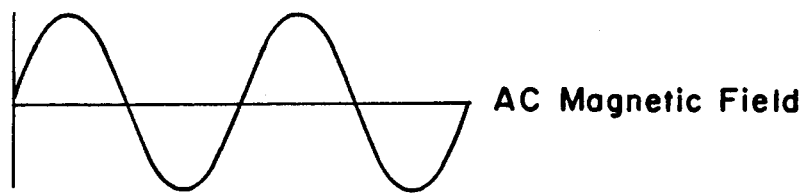
Fig. 8f — AC Magnetic Field
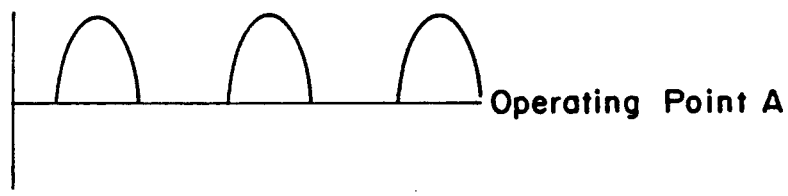
Fig. 8a — Operating Point A
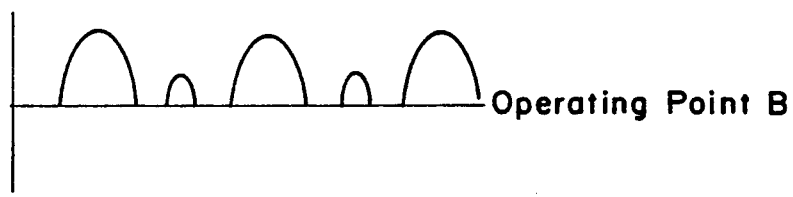
Fig. 8b — Operating Point B
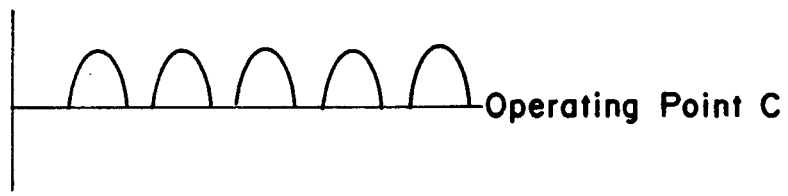
Fig. 8c — Operating Point C
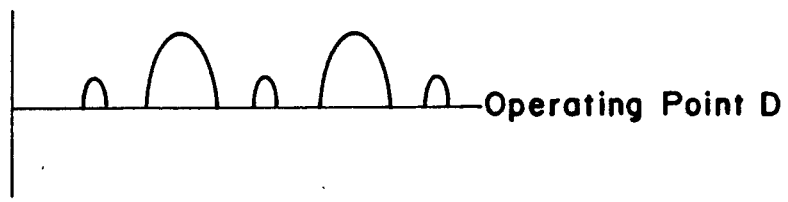
Fig. 8d — Operating Point D
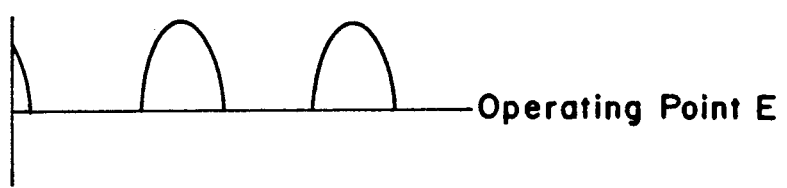
Fig. 8e — Operating Point E

PLURAL SUPERCONDUCTIVE MAGNETORESISTORS FOR MEASURING DISTRIBUTION OF MAGNETIC FIELD WITH INDIVIDUAL BIASING APPLIED SEQUENTIALLY

BACKGROUND OF THE INVENTION

1. Field of The Invention

The present invention relates to an apparatus for measuring the strength of a magnetic field and, more particularly, to an apparatus for measuring a magnetic field distribution by arranging a plurality of magnetoresistive elements made of a superconductor having a weak coupling at the grain boundaries.

2. Description Of The Prior Art

It has been common to use a magnetoresistive effect for the detection and the measurement of a simple magnetic field. The magnetoresistive element is achieved by a shape effect of a semiconductor such as InSb or InAs having a high mobility of electrons or by an orientation effect of a ferro magnetic metal such as Fe-Ni alloy or Co-Ni alloy. Research work has been developing to measure or detect, in a high resolution, a weak magnetic field with a magnetoresistive effect of an oxide superconductive material having a weak coupling at the grain boundaries.

In addition to the above method, an extremely weak magnetic field has been detected with the SQUID method using a Josephson effect. For this purpose the Nb mixed allow alloy has been used and should be cooled by liquid He.

In an apparatus of measuring the distribution of magnetic fields and the magnetic field variation with time by using the elements for measuring the magnetic field mentioned above, it is necessary to have a plurality of elements positioned at a plane area necessary for the magnetic distribution measurement.

When the magnetic field distribution and its variation are measured with the method mentioned above, an individual element of measuring the magnetic field is apt to be bulky in size, and must be provided with a lead wire for supplying the electric current and for measuring voltage. It is accordingly difficult to arrange densely the magnetic elements and to elevate the resolution ability of detecting the magnetic field. In addition, each of magnetic elements must be connected with a detecting circuit and there is consequently a problem, that the apparatus cannot be manufactured of small size and in a low cost.

SUMMARY OF THE INVENTION

An object of the present invention is to provide an improved apparatus for measuring the magnetic field distribution which can solve the problem intrinsic to the prior art apparatus.

Another object of the present invention is to provide an apparatus for measuring the magnetic field distribution by using magnetoresistive elements made of an oxide superconductive material having a weak coupling at the grain boundaries, in which said magnetoresistive elements are arranged at a high density so as to make a detecting circuit simple.

An apparatus of measuring the magnetic field distribution according to the present invention comprises a very sensitive superconductive magnetoresistive elements made of an oxide superconductive material having a weak coupling at the grain boundaries. The magnetoresistive elements are prepared in the following way that a substrate made of a non-magnetic material has a oxide superconductive film applied thereto. The superconductive film has a weak coupling at the grain boundaries and forms a given number of magnetoresistive elements in a meander form. Furthermore, the substrate has a circuit to connect the magnetoresistive elements in series. A circuit including the magnetoresistive elements in series connection has a number of electric current electrodes for supplying a bias electric current and a number of voltage electrodes for detecting a voltage generated by the magnetoresistive effect due to the magnetoresistive elements in a series connection. The circuit is provided with an apparatus for supplying individually and in a time shearing manner a bias magnetic field to each of magnetoresistive elements. The magnetoresistive elements have a voltage generated synchronously with an application of the bias magnetic field from the apparatus of supplying a bias magnetic field. It is possible to determine a magnetic field distribution and the variation with a time by measurement of the voltage induced at the magnetoresistive elements. By the employment of the above structure and measuring method, it is possible to set up an apparatus for measuring a magnetic field distribution in high precision and to make the measurement simpler.

The apparatus of measuring a magnetic field distribution comprises a plurality of superconductive magnetoresistive elements made of an oxide superconductive material having a weak coupling at the grain boundaries. In accordance with the variation in the size of bias current applied to the superconductive magnetoresistive element, it is possible to change the threshold level of magnetic field, at which the superconductive magnetoresistive element starts to generate a magnetoresistive effect.

The superconductive magnetoresistive elements, except the one supplied with a magnetic field greater than the threshold level, are forced to be in a magnetic strength below the threshold level of magnetic field. A position can be determined by a superconductive magnetoresistive element which generates the magnetoresistive under application of a bias magnetic field while a strength of the magnetic field at the position determined in the above way can be determined by a magnetoresistive of the superconductive magnetoresistive element at the position. By repeating systematically such a measurement, it is possible to measure the magnetic field distribution.

In order to achieve aforementioned objectives, the present invention provides an apparatus for measuring a superconductive magnetic field distribution comprising a detecting device having an electrode for a bias current and an electrode for a voltage which are formed at two terminals across a series connection of magnetoresistive elements which are made of a superconductive material having a weak coupling at the grain boundaries and are arranged on a substrate of a nonmagnetic material and means of applying sequentially, in a time sharing way, a bias magnetic field to each of said magnetoresistive elements.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 8a to 8f show waveforms of the output power generated from the apparatus according to the present invention with a change in the strength of the external magnetic field.

DETAILED DESCRIPTION OF THE PREFERRED EMBODIMENTS

Figure 1A:
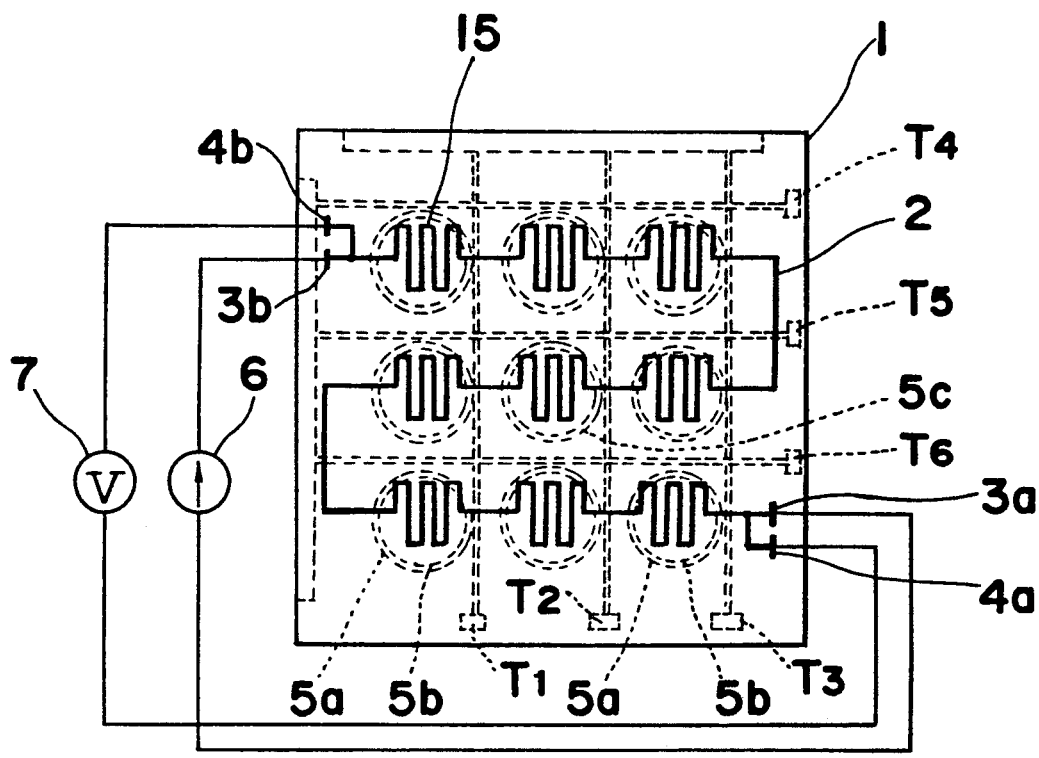
FIGS. 1a and 1b show diagrammatic views of an apparatus according, to a preferred embodiment of the present invention.
Figure 1B:
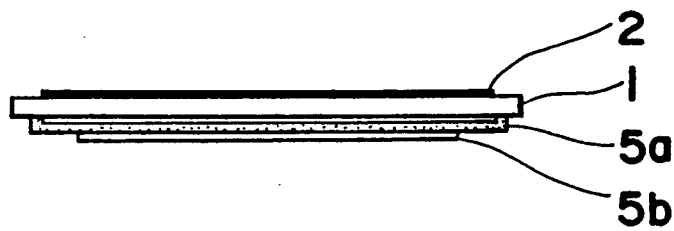

Referring to FIGS. 1a and 1b, an apparatus for measuring a magnetic field distribution using a superconductive element, according to the present invention is shown.

The detecting part will be first explained. A substrate 1 made of a non-magnetic material with a size of $80 \times 80$ mm$^2$ has an oxide superconductive film formed thereon. The oxide superconductive film comprises many oxide fine grains which are combined together through thin insulating films or are combined weakly together at points. The oxide superconductive film is formed into magnetoresistive elements 15 and arranged in a meander form and are serially connected by a line 2. The series connection of magnetoresistive elements 15 by line 2 has, at opposite ends thereof, current terminals 3a and 3b for supplying a predetermined biasing current from a current source 6, and voltage terminals 4a and 4b for detecting a voltage drop therebetween by a voltage meter 7. The terminals 3a, 3b, 4a and 4b are formed by electrodes prepared thereon by evaporation of titanium. This structure makes a detecting device (shown by FIG. 1a) of measuring a magnetic field distribution. The detecting device has superconductive magnetoresistive elements 15 connected in series to each other.

Provided at the back of the substrate 1 are film coils 5a and 5b formed in a manner described later in connection with FIGS. 4a–4c later. These coils 5a and 5b are provided for applying individually, in a time sharing manner, a bias magnetic field to each of superconductive magnetoresistive elements 15. The film coil 5a or 5b at each of the layers has an electric current flowing between a common electrode and separate terminals T1-T6. An electric source for supplying a coil current will be described later in connection with FIG. 6.

Figure 2:
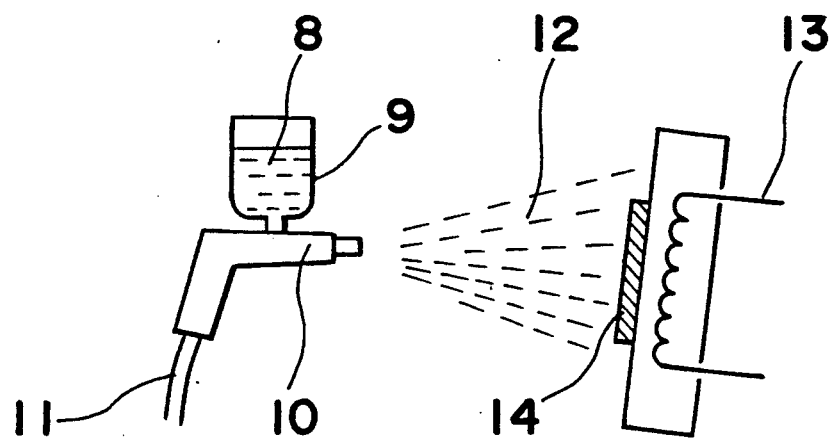
FIG. 2 is a diagrammatic view showing a method for making an oxide superconductive film by a spray pyrolysis method.

FIG. 2 shows a schematic illustration of an apparatus for manufacturing a superconductive film by using a spray pyrolysis method. The prepared superconductive film is in a compound of Y-Ba-Cu-0 system. The starting materials Y(NO$_3$)$_3$ 6H$_2$O, Ba(NO$_3$)$_2$ and Cu(NO$_3$)$_2$ 3H$_2$O are weighed into an element ratio of (YBa$_2$Cu$_3$) and are dissolved in water to make an aqueous solution 8 thereof. The aqueous solution 8 is put in a container 9 installed at a spray gun 10 and is formed into mists 12 through a pipe 11 with a pressured air. The mists 12 are sprayed to the substrate 14 heated at a temperature of 600° C. with a heater 13. The starting materials included in the aqueous solution 8 are thermally decomposed into oxides to make a ceramic film. The ceramic film prepared according to the embodiment is in a thickness of 10 μm and is subjected to a heat treatment for giving the ceramic film a superconductive characteristic.

The oxide superconductive material is in a composition of a Y-system at this embodiment but is not limited to the composition. Any other composition such as a Bi-system, Tl-system or the partial substitution thereof can be used as an oxide superconductive material. It is also possible to use any other method for preparing the superconductive film such as sputtering method or a chemical vapor deposition method in place of the spray pyrolysis method. An excellent characteristic of the superconductive film can be obtained by using a superconductive film in a thickness of 1-10 μm.

The superconductive film prepared in such a way is subjected to a usual dry etching process for forming superconductive magnetoresistive elements 15 and the line 2 connecting the superconductive magnetoresistive elements in series as shown in FIG. 1a.

Figure 3:
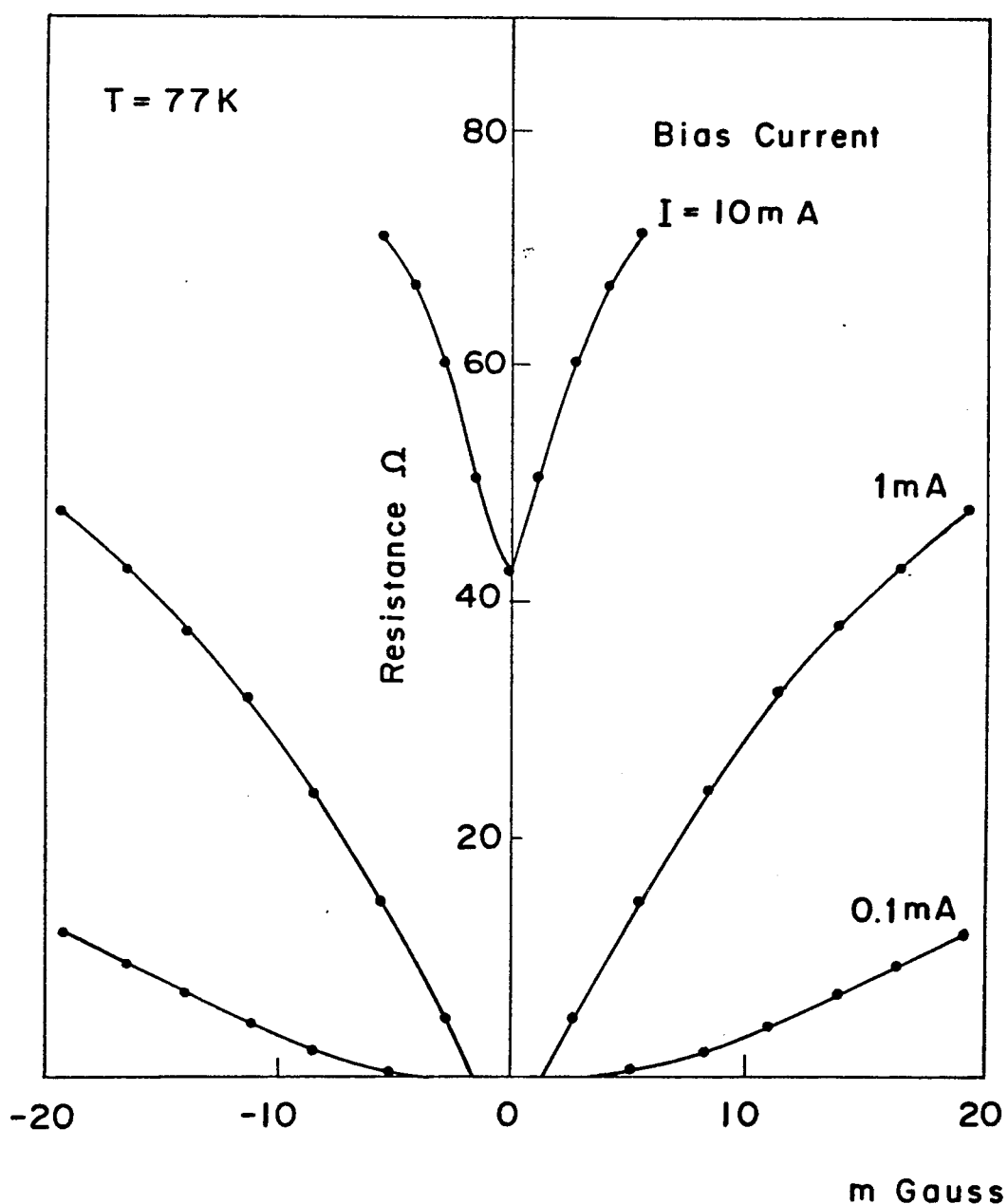
FIG. 3 shows a relationship between a bias magnetic field and a magnetoresistive of the superconductive magnetoresistive element used in the present embodiment.

Referring to FIG. 3, examples of the magnetoresistive characteristics of the superconductive magnetoresistive element as a function of the applied magnetic field with different bias currents are shown. The superconductive magnetoresistive characteristics shown in FIG. 3 is such that when the bias current is lower than a certain value with the magnetic field lower than a certain threshold level, the magnetoresistive element shows magnetoresistive value of 0, meaning that the magnetoresistive element is in a superconduction state. As the increase of the magnetic field after reaching the threshold level, the magnetoresistive increases rapidly.

It is noted that when the bias current is higher than a threshold level, the magnetoresistive element shows some degree of magnetoresistive even when the magnetic field is zero. In this case, the magnetoresistive increases further rapidly with the increase of the applied magnetic field.

Figure 4A:
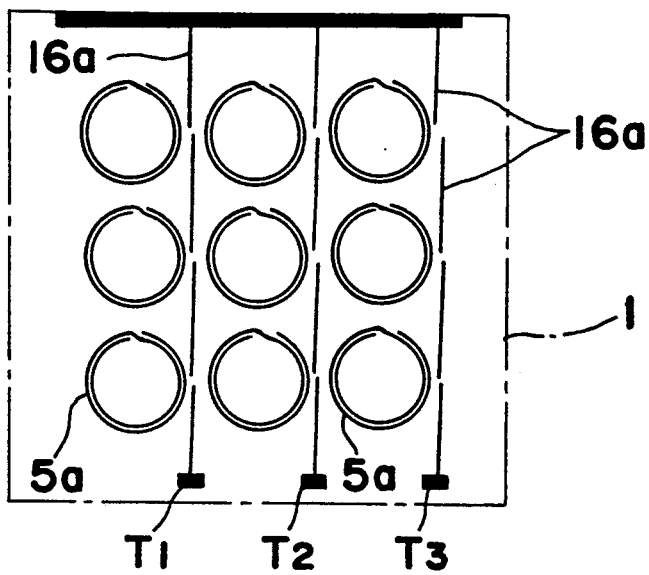
FIGS. 4a, 4b and 4c show a plan view of film coils used in the embodiment.
Figure 4B:
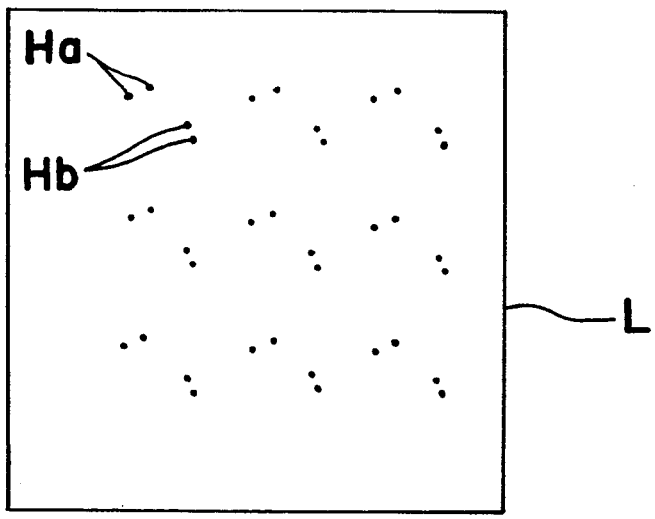
Figure 4C:
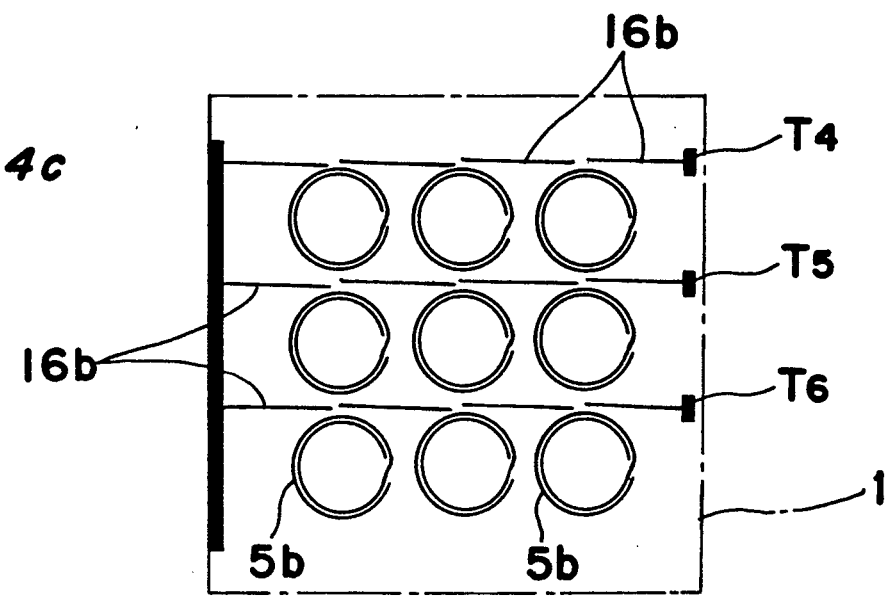

Referring to FIGS. 4a, 4b and 4c, a coil arrangement of a double layer structure is shown which is constructed by upper electrode pattern (FIG. 4a), lower electrode pattern (FIG. 4c) and an insulation layer L (FIG. 4b) sandwiched therebetween.

As shown in FIG. 4a, the upper electrode pattern formed directly on the bottom surface of the substrate 1 includes electrodes for forming upper film coils 5a and lines 16a extending vertically. The coils 5a and lines 16a are spaced to provide an electrical insulation therebetween.

Deposited over the upper electrode pattern (FIG. 4a) is the insulation layer L (FIG. 4b) made of electrically non-conductive material. The insulation layer L has a plurality of through holes Ha and Hb at positions corresponding to free ends of coils 5a and lines 16a. Each through hole is filled with an electrically conductive material.

As shown in FIG. 4c, the lower electrode pattern deposited over the insulation layer L includes electrodes for forming lower film coils 5b and lines 16b extending horizontally. The coils 5b and lines 16b are spaced to provide an electrical insulation therebetween.

When the upper and lower electrode patterns are placed one over the other with insulation layer L sandwiched therebetween, the vertically aligned three coils 5b, for example, at the left column in FIG. 4c are connected in series by three electrode segments 16a through the through holes Hb. In the example shown in FIGS. 4a–4c, there will be made three columns of coil arrangement. The three columns are separately provided with exciting current from terminals T1, T2 and T3, respectively.

Likewise, the horizontally aligned three coils 5a, for example, at the top row in FIG. 4a are connected in series by three electrode segments 16b through the through holes Ha. In the example shown in FIGS. 4a–4c, there will be made three rows of coil arrangement. The three rows are separately provided with exciting current from terminals T4, T5 and T6, respectively.

Each coil on each pattern is formed by a two turn coil, but when the two electrode patterns are placed one over the other each coil results in a four turn coil. The number of turns can be varied. By the above coil arrangement, only one coil of the nine coils can be excited with a maximum level. For example, when terminals T2 and T5 are provided simultaneously with a same waveform signal, a coil located at the center of the nine coils is excited with the maximum level, the coils at the four corners are excited with zero level, and the remaining coils are excited with mid level. By changing the coil to which the maximum exciting level is applied, the superconductive magnetoresistive element 15 which receives the bias magnetic field generated by the maximum exciting level can be varied. In other words, the superconductive magnetoresistive elements 15 can be supplied with the bias magnetic field separately and one at a time.

The film coil arrangement shown in FIGS. 4a–4c are prepared in the following steps. The substrate 1 has an aluminum thin film applied at the back side thereof and are subjected to a wet etching process to form the pattern shown in FIG. 4a. The formed aluminum thin film has an insulating film of silicon oxide applied thereon by a sputtering method. The insulating film of silicon oxide has through holes formed therethrough by a wet etching method. The through holes can be used for connecting the aluminum thin films in a pattern at the first layer and the second layer to each other. An aluminum thin film is again prepared by the sputtering method and is formed into the pattern on the second layer as shown in FIG. 4b.

Figure 5:
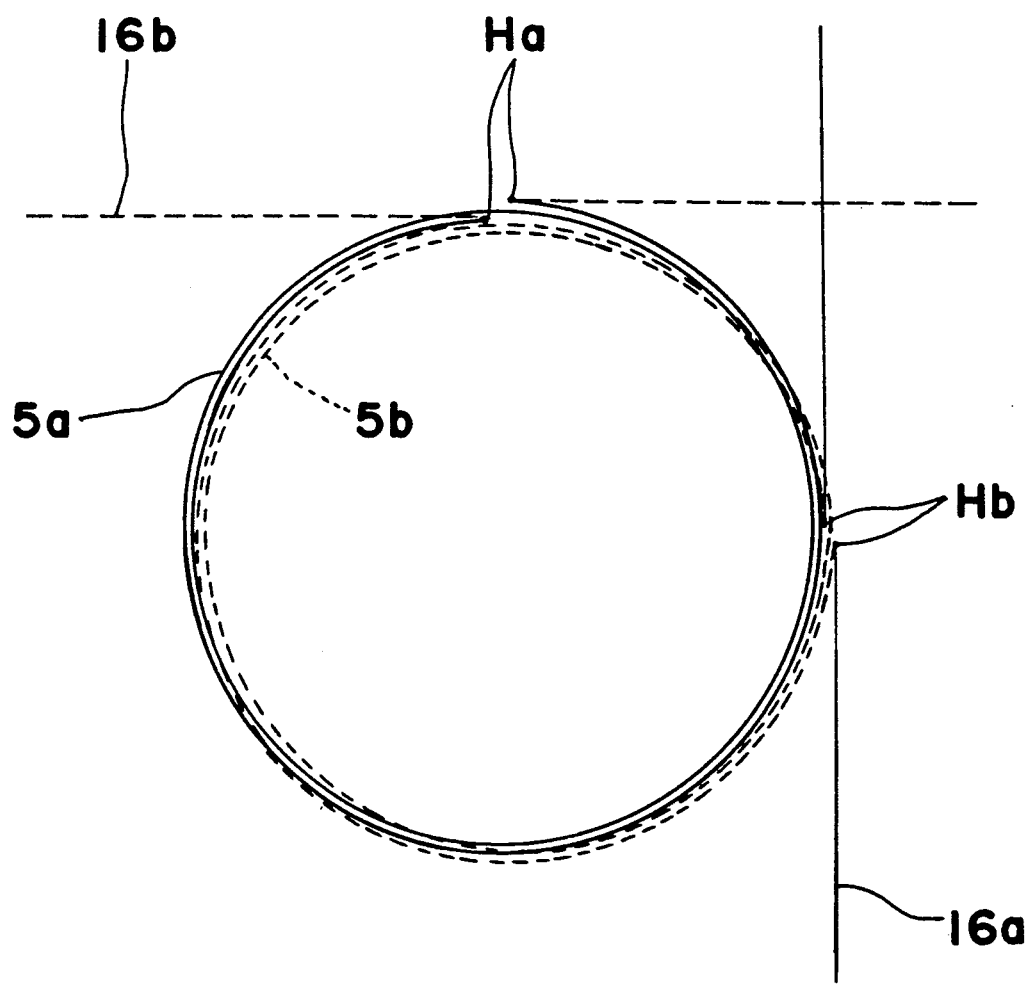
FIG. 5 is a diagrammatic view showing an arrangement of film coils formed on two layers.

FIG. 5 shows an enlarged view of the coil pattern formed by two layers of aluminum thin film. The coil thus prepared is of a two turn type and has a line width and line pitch of 100 $\mu$m, respectively with a coil diameter of 16 mm.

If the coils at the two layers are put together in a concentric circle arrangement, the coils at the two layers would be short-circuited at the through hole connection area, resulting in inoperable coils. To avoid such a disadvantage, it is necessary to shift the center of coil 5b from that of coil 5a. In FIG. 5, the coil 5a at the upper electrode pattern layer shown by a solid line is connected to line 16b of the lower electrode pattern layer via through holes Ha in the insulation aluminum thin film. A coil 5b at the lower electrode pattern layer shown by a dotted line is connected via through holes Hb to a circuit 16a of the upper electrode pattern layer. A shifting distance between the centers of coils 5a and 5b is 300$\mu$m.

Figure 6:
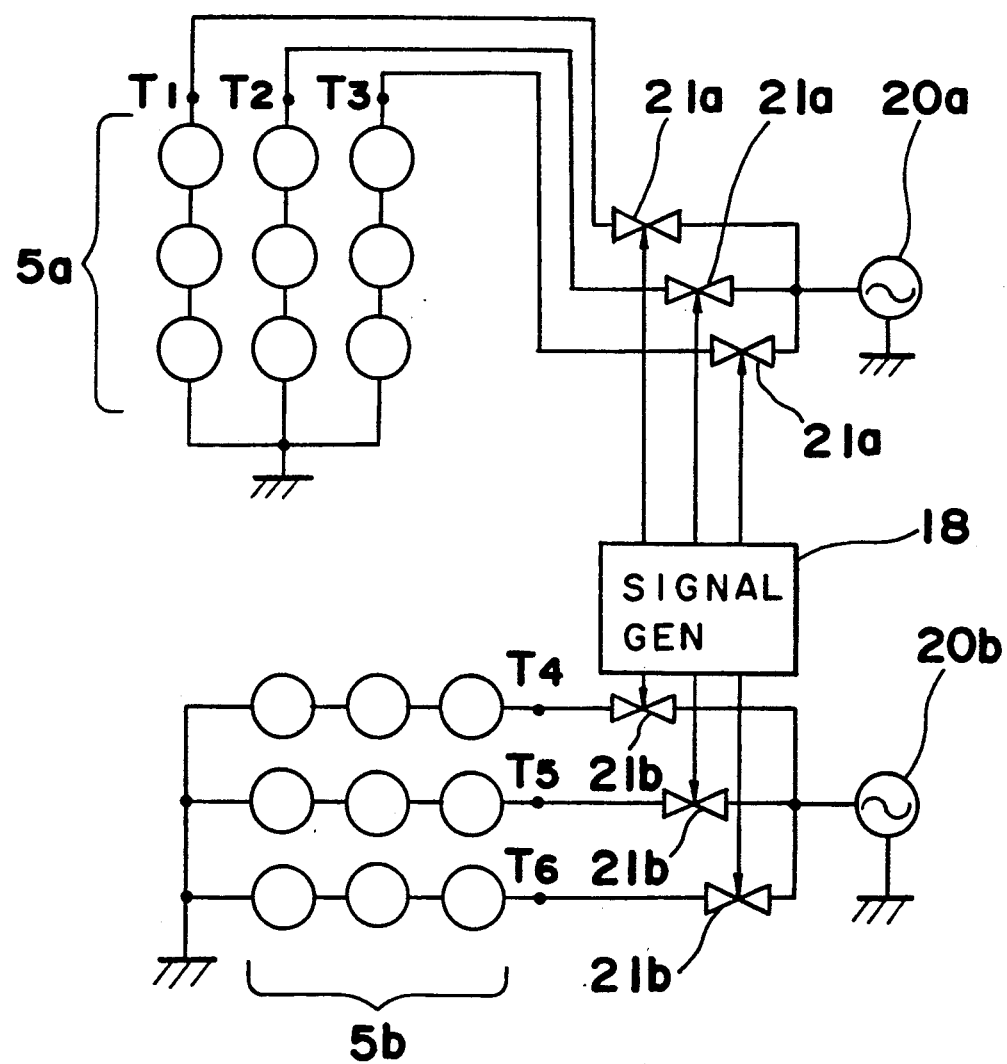
FIG. 6 is a block diagram of a generator for generating an AC bias magnetic field.

FIG. 6 shows a block diagram of a bias magnetic field generator comprising the coils 5a at the upper layer and the coils 5b at the lower layer. The magnetic field generator comprises a switching signal generator 18 by which an electric currents to the coils 5a and 15b are controlled through switches 21a and 21b, in which switches 21a are positioned between the terminals T1, T2, T3 and bias alternate current source 20a, and switches 21b between the terminals T4, T5 and T6 and bias alternate current source 20b. The bias alternate current sources 20a and 20b operated synchronously to provide the same waveform currents at the same time.

A switching signal generated from the signal generator 18 is transmitted to the switches 21a and 21b so as to switch the current to the coils 5a and 5b. A bias current from the current source 20a flows to one of three columns of the coils 5a to excite simultaneously the three coils aligned in said one column, and a bias current from the current source 20b flows to one of three rows of the coils 5b to excite simultaneously the three coils aligned in said one row. Thus, a maximum magnetic field is generated at a point where the excited coils 5a aligned in said one column and the excited coils 5b aligned in said one row intersect. A magnetic field with a strength of half the maximum magnetic field is generated at the excited coils, but other than that at the intersecting point.

Thus, by controlling the signals from signal generator 18, it is possible to provide the maximum magnetic field to one of nine superconductive magnetoresistive element 15. Thus, by setting the current level from current sources 20a and 20b to a preselected level, it is possible to give the superconductive magnetoresistive element a magnetoresistive at the maximum level magnetic field which is greater than the threshold level, and not to give the superconductive magnetoresistive element a magnetoresistive at the mid level magnetic field which is lower than the threshold level. A magnetic field distribution measuring apparatus according to the present invention measures the magnetic field distribution by using the above fact as explained below with reference to FIGS. 7a–7c.

As explained with reference to FIG. 3, the change in the resistance as well as the change in the magnetic field threshold level at which the superconductive magnetoresistive resistive element 15 starts showing the magnetoresistive characteristic depends on the change of the applied bias current flowing through the superconductive magnetoresistive element 15. Based on the above fact, the embodiment according to the present invention employs the arrangement with the characteristics shown in FIG. 7a, wherein the bias current flowing through the superconductive magnetoresistive element 15 is set to 2.5 mA. In this case, the magnetic field threshold level is 10 m gauss, meaning that the superconductive magnetoresistive element 15 shows a superconduction state when the applied magnetic field is less that 10 m gauss, and shows magnetoresistive when the applied magnetic field becomes greater than 10 m gauss.

Figure 7A:
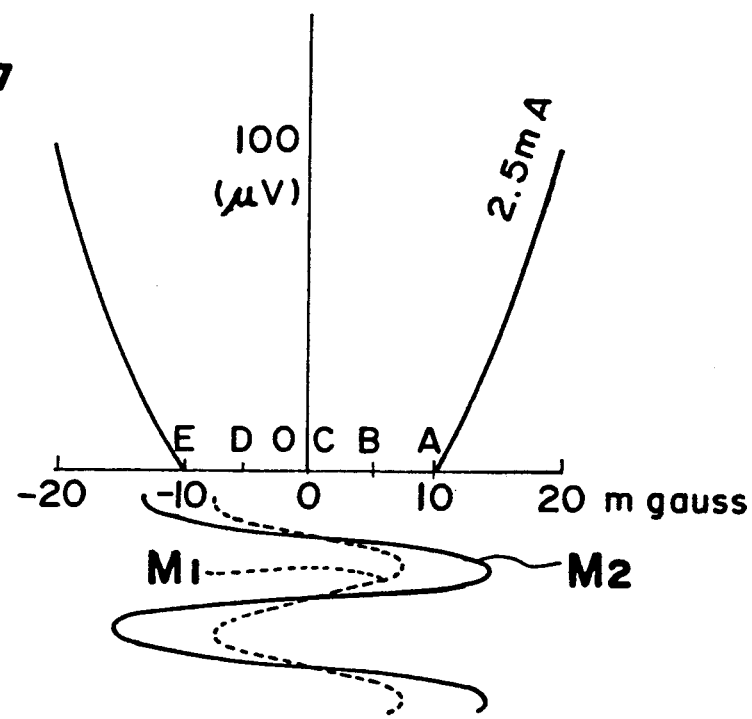
FIGS. 7a, 7b and 7c show graphs for explaining the detection of a magnetic field by using a magnetoresistive element of the embodiment.

In the operation explained hereinbelow, it is assumed that terminals T2 and T5 are applied with sinusoidal exciting currents from current sources 20a and 20b, respectively, so that the center coil 5c shown in FIG. 1 is excited to produce the maximum magnetic field as shown by a curve M2 shown in FIG. 7a, and the coils at the center rows and center columns, but other than the center coil 5c, are excited to produce the mid level magnetic field as shown by a curve M1 shown in FIG. 7a, provided that no external magnetic force is present.

More specifically, an AC current having a peak of 50 mA at a frequency of 1 kHz from the current source 20a is applied to the coils in the center column connected to terminal T2. At this point, each coil of the coils in the center column generates a magnetic field of 7.5 m gauss at the peak value. Then, additionally, an AC current having a peak of 50 mA at a frequency of 1 kHz in the same phase as that of the above is applied to the coils in the center row from the current source 20a. At this point, each coil of the coils connected to terminal T5 in the center row generates a magnetic field of 7.5 m gauss at the peak value. Thus, the center coil 5c generates a magnetic field of 15 m gauss at the peak value, while other excited coils generate a magnetic field of 7.5 m gauss at the peak value. Such a magnetic field produced by the current flowing through the coil is referred to as a bias magnetic field, in contrast to an external magnetic field produced from a test piece positioned adjacent the superconductive magnetic field distribution measuring apparatus.

Figure 7B:
Figure 7C:
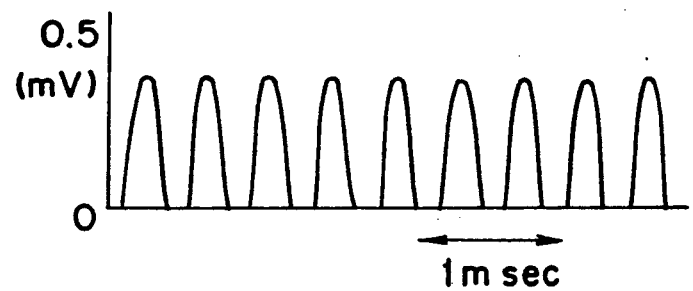

FIGS. 7a, 7b and 7c show a relationship between a bias magnetic field applied to each of the superconductive magnetoresistive elements 15 at an external magnetic field of zero and an output voltage generated across the superconductive magnetoresistive element 15. According to the above assumption, only the center coil 5c generates a magnetic field in a strength shown by a waveform M2 which sometimes shows a magnetic field greater than the magnetic field threshold level. Other center column and center low magnetoresistive elements 15 are provided with a magnetic field shown by a waveform M1 which is always lower than the magnetic field threshold level. Thus, the center superconductive magnetoresistive element 15 provided in association with the center coil 5c produces a pulsating output voltage signal, as shown in FIG. 7c, while the remaining superconductive magnetoresistive elements 15 produces no output voltage signal, as shown in FIG. 7b. Such an output voltage signal is detected by voltage meter 7 shown in FIG. 1.

When the center superconductive magnetoresistive element 15 is provided with an external magnetic field in different strengths shown by points A, B, C, D and E along abscissa in FIG. 7a, the operating point of waveforms M1 and M2 is shifted from the zero point to points A, B, C, D and E, resulting in the output voltage signal as shown by waveforms of FIGS. 8a, 8b, 8c, 8d and 8e, respectively.

It is to be noted that FIG. 8f shows a waveform of the AC bias magnetic field. When the waveforms of FIGS. 8a-8e are compared with the waveform of FIG. 8f, the phase is slightly shifted due to the delay in the various circuits such as amplifiers.

Figure 9:
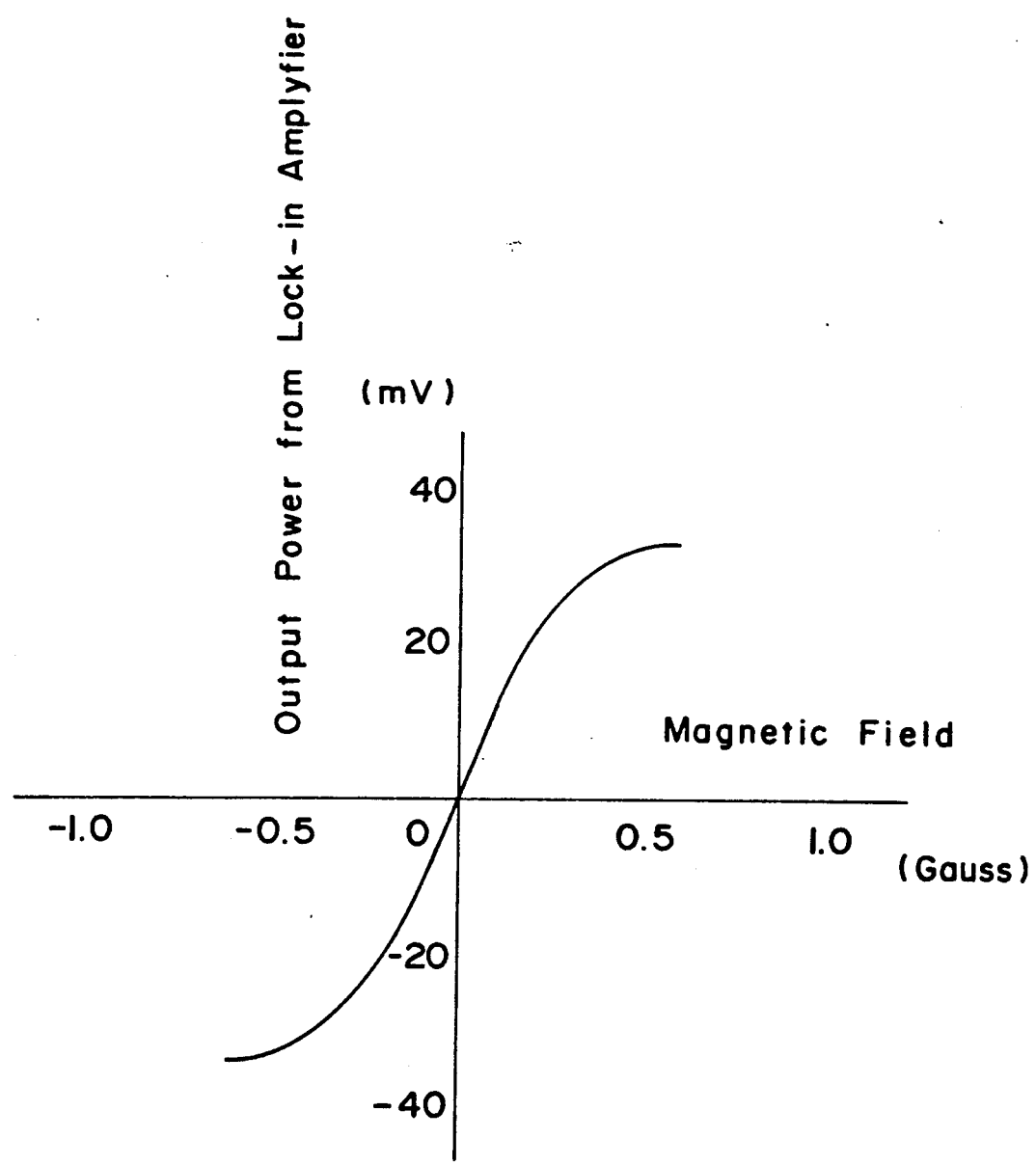
FIG. 9, shows a relationship between a strength of an external magnetic field and an output power from a lockin amplifier receiving an output signal from the apparatus of the present invention.

The variations in the output voltage signals shown by waveforms of FIGS. 8a-8e are input to a lock-in amplifier. FIG. 9 shows a relationship between the output powers from the lock-in amplifier and static magnetic fields applied as external magnetic fields. The graph of FIG. 9 shows an excellent linear relationship mentioned between the output power from the lock-in amplifier and the magnetic field, within a range of 0.1 gauss. It is noted that the apparatus of measuring a magnetic field according to the present invention can measure the external magnetic field at a high accuracy within the range of 0.1 gauss.

The above description explains the measurement carried out by applying an AC bias magnetic field to the center superconductive magnetoresistive element 15. When the alternative bias magnetic field is sequentially applied to each of the superconductive magnetoresistive elements with a signal generated from a signal exchanging device, it is possible to measure, in a time sharing manner, the external magnetic field at a position where each of superconductive magnetoresistive elements is positioned. In other words, by sequentially changing the coil to which the maximum magnetic field is applied, is it possible to detect the distribution of magnetic field strength along the surface of a test piece positioned adjacent the superconductive magnetic field distribution measuring apparatus of the present invention. This makes it possible to measure a magnetic field in two dimensions. It is noted that the superconductive magnetoresistive element has a response time in a high speed (in a pico second order). Thus, it is possible to measure a time variation in the magnetic field by changing the measuring time into a high speed capable of following to the variation in the external magnetic field.

The present invention has been explained with reference to the embodiment but should not be limited to the embodiment, but various modifications are possible. For example, it is possible to change the characteristic of the superconductive magnetoresistive element or the amount of applied bias current in accordance with the application without loosing the effect aimed by the present invention. It is also possible to change a size of a substrate and a number of the superconductive magnetoresistive elements aligned on the substrate 1. A film coil for applying a bias magnetic field can be changed in the turn number, the coil diameter and the shape. The coil shape is of a circle at the embodiment but is allowable to use a square or a polygon. It is possible to change the amount and the frequency of current flowing through the coil to produce a bias magnetic field in accordance with the application. The overlapped direct current flowing through the coil can generate a direct bias magnetic field. Beside these changes, it is possible to make various type of changes for realizing the effects of the present invention for the measurement of a magnetic field.

An apparatus according to the present invention realizes the characteristic of an oxide superconductive material having a weak coupling at the grain boundaries and is in a simple structure for measuring a magnetic field. The superconductive magnetoresistive element produces an intrinsic noise which is largest at a low frequency of several Hz. The present invention can avoid the noise and can make an apparatus capable of measuring, in a high resolution, even under a very weak magnetic field distribution.

When the output signal generated from the apparatus of measuring a magnetic field according to the present invention is subjected to a high speed treatment by a computer, it is possible to determine a position of a generation source for a magnetic field and analyze the state of the magnetic field. These capabilities can expand the application area to a medical use and a nondestructive testing.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A magnetic field distribution measuring apparatus for measuring an external magnetic field distribution comprising:
    a substrate made of nonmagnetic material and having a first surface and a second surface;
    a plurality of magnetoresistive elements deposited on said first surface of said substrate, each one of said plurality of magnetoresistive elements made of superconductive material having a weak coupling at the grain boundaries the magnetoresistive elements connected is series;
    a distinct bias magnetic field element corresponding to each magnetoresistive element for applying a bias magnetic field individually in a time sharing manner, to each one of said magnetoresistive elements; and
    means for detecting a distribution of voltage drop across said plurality of magnetoresistive elements.

2. A magnetic field distribution measuring apparatus of measuring an external magnetic field distribution comprising:
    a substrate mad of a nonmagnetic material and having a first surface and a second surface;
    a plurality of magnetoresistive elements deposited on said first surface of said substrate and each made of a superconductive material having a weak coupling at the grain boundaries;
    means for applying a bias magnetic field individually to each said magnetoresistive element; and
    means for detecting a distribution of voltage drop across said plurality of magnetoresistive elements;
    wherein said plurality of magnetoresistive elements are connected in series between a first pair of terminals connectable to current source and also between a second pair of terminals connectable to a voltage meter, and wherein said applying means applies sequentially to said magnetoresistive elements a bias magnetic field having a strength lower than a predetermined bias magnetic field threshold level at which said magnetoresistive element changes the state from a superconductive state to a magnetoresistive state.

3. A magnetic field strength measuring apparatus as claimed in claim 2, wherein said plurality of magnetoresistive elements are connected in series by a conductor formed by the same material as that used for making said magnetoresistive elements.

4. A magnetic field distribution measuring apparatus for measuring an external magnetic field distribution comprising:
    a substrate made of nonmagnetic material and having a first surface and a second surface;
    a plurality of magnetoresistive elements deposited on said first surface of said substrate and each made of a superconductive material having a weak coupling at the grain boundaries;
    means for applying a bias magnetic field individually to each said magnetoresistive element; and
    means for detecting a distribution of voltage drop across said plurality of magnetoresistive element;
    wherein said applying means comprises a coil means deposited on said second surface of said substrate at a position corresponding to said magnetoresistive element, and a current supplying means for supplying a predetermined bias current to said coil means, said current supplying means supplies AC current to generate AC bias magnetic field with a peak value being greater than a magnetic field threshold level at which said each magnetoresistive element changes the state from a superconductive state to a magnetoresistive state.

5. A magnetic field distribution measuring apparatus as claimed in claim 4, wherein said applying means comprises a plurality of coils deposited on said second surface of said substrate at positions corresponding to said magnetoresistive elements, and a current supplying means for supplying a predetermined bias current sequentially to said plurality of said coils.

6. A magnetic field distribution measuring apparatus as claimed in claim 5, wherein each of said coils comprises first coil element deposited on said second surface of said substrate and a second coil element deposited over said first coil element through an insulation layer.

7. A magnetic field distribution measuring apparatus as claimed in claim 6, wherein said magnetoresistive elements are aligned in a first plane, and said coils are aligned in a second plane adjacent to said first plain at positions corresponding to said magnetoresistive elements.

8. A magnetic field distribution measuring apparatus as claimed in claim 7, wherein said first coil elements aligned in a first direction are connected in series to provide a plurality of first series connections, and said second coil elements aligned in a second direction are connected in series to provide a plurality of second series connections.

9. A magnetic field distribution measuring apparatus as claimed in claim 8, wherein said current supplying means comprises a first current source coupled with a first switching means for supplying a current to a selected one of a plurality of said first series connections, and a second current source coupled with a second switching means for supplying a current to a selected one of a plurality of said second series connections, whereby a coil at an intersection between said selected first and second series connections produces a highest magnetic field among the coils.

10. A magnetic field distribution measuring apparatus as claimed in claim 9, wherein each of said first and second current supplying means supplies AC current to generate AC bias magnetic field so that a peak value of the magnetic field as produced from the coil at said intersection being greater than a magnetic field threshold level at which said magnetoresistive element changes the state from a superconductive state to a magnetoresistive state.

11. A magnetic field distribution measuring apparatus as claimed in claim 9, wherein first and second switching means is so operated as to sequentially change the coil that produces the highest magnetic field for the detection of magnetic field distribution over the alignment of said magnetoresistive element.

12. A magnetic field strength measuring apparatus as claimed in claim 1 wherein said distinct bias magnetic field element is located on said second surface.

* * * * *